(12) United States Patent
Bi et al.

(10) Patent No.: US 12,480,198 B2
(45) Date of Patent: Nov. 25, 2025

(54) MASK, AND MANUFACTURING METHOD FOR MASK

(71) Applicant: BOE Technology Group Co., Ltd., Beijing (CN)

(72) Inventors: Na Bi, Beijing (CN); Shanshan Bai, Beijing (CN); Yue Liu, Beijing (CN)

(73) Assignee: Beijing BOE Technology Group Co., Ltd., Beijing (CN)

( * ) Notice: Subject to any disclaimer, the term of this patent is extended or adjusted under 35 U.S.C. 154(b) by 541 days.

(21) Appl. No.: 17/802,263

(22) PCT Filed: Oct. 22, 2021

(86) PCT No.: PCT/CN2021/125631
§ 371 (c)(1),
(2) Date: Aug. 25, 2022

(87) PCT Pub. No.: WO2022/134818
PCT Pub. Date: Jun. 30, 2022

(65) Prior Publication Data
US 2023/0085315 A1    Mar. 16, 2023

(30) Foreign Application Priority Data
Dec. 24, 2020 (CN) .......................... 202011548822.5

(51) Int. Cl.
*C23C 14/04* (2006.01)
*B23K 26/24* (2014.01)

(52) U.S. Cl.
CPC ............ *C23C 14/042* (2013.01); *B23K 26/24* (2013.01)

(58) Field of Classification Search
CPC .................................................. C23C 14/042
See application file for complete search history.

(56) References Cited

U.S. PATENT DOCUMENTS

| | | | |
|---|---|---|---|
| 2008/0018236 A1* | 1/2008 | Arai | C23C 14/042 445/24 |
| 2011/0220019 A1* | 9/2011 | Lee | C23C 14/042 118/504 |

(Continued)

FOREIGN PATENT DOCUMENTS

| | | |
|---|---|---|
| CN | 206279261 U | 6/2017 |
| CN | 207775333 U | 8/2018 |

(Continued)

OTHER PUBLICATIONS

CN202011548822.5 first office action.
CN202023169232.X first office action.

*Primary Examiner* — Keath T Chen
(74) *Attorney, Agent, or Firm* — IPro, PLLC (57) ABSTRACT

Disclosed are a mask and a manufacturing method for the mask, aiming to solve the problem in the prior art of the easy occurrence of color mixing due to the inaccurate position of evaporation when a pattern of a light-emitting substrate is formed by means of a mask. The mask for covering a mother board, which is formed by a multi-division exposure procedure and thus has a substrate invalid region that cannot be exposed due to the multi-division exposure procedure, comprises: a metal frame; a support mask located on one side of the metal frame; at least one fine metal mask strip, which is located on the side of the support mask that faces away from the metal frame, and is provided with multiple openings for the evaporation of a light-emitting film for sub-pixels in the mother board; and a support plate located between the metal frame and the fine metal mask for covering the substrate invalid region, with the thickness of the support plate being greater than that of the support mask.

20 Claims, 5 Drawing Sheets

(56) References Cited

U.S. PATENT DOCUMENTS

| | | | |
|---|---|---|---|
| 2016/0310988 A1* | 10/2016 | Lee ......................... | H01L 21/67 |
| 2016/0348227 A1* | 12/2016 | Wu ........................ | H10K 71/164 |
| 2017/0062258 A1* | 3/2017 | Bluck ...................... | H10F 71/00 |
| 2017/0342543 A1* | 11/2017 | Ghosh ..................... | H01L 21/682 |
| 2019/0211436 A1* | 7/2019 | Nishida ................... | H10K 71/00 |
| 2019/0352765 A1* | 11/2019 | Ono ........................ | C25D 1/10 |
| 2020/0407836 A1 | 12/2020 | Luo et al. | |
| 2021/0249603 A1* | 8/2021 | Kim ....................... | C23C 14/042 |

FOREIGN PATENT DOCUMENTS

| | | | |
|---|---|---|---|
| CN | 109023238 A | 12/2018 | |
| CN | 110129723 A | 8/2019 | |
| CN | 110343999 A | 10/2019 | |
| CN | 111394690 A | 7/2020 | |
| CN | 111676445 A | 9/2020 | |
| CN | 111733380 A | 10/2020 | |
| CN | 111962019 A | 11/2020 | |
| CN | 112080720 A | 12/2020 | |
| CN | 112662995 A | 4/2021 | |
| CN | 215628244 U | 1/2022 | |
| JP | 2010242141 A | 10/2010 | |

\* cited by examiner

MASK, AND MANUFACTURING METHOD FOR MASK

CROSS REFERENCE TO RELATED APPLICATIONS

This application is a US National Stage of International Application No. PCT/CN2021/125631, filed on Oct. 22, 2021, which claims priority to Chinese Patent Application No. 202011548822.5 filed to the CNIPA on Dec. 24, 2020 and entitled "Mask, and Manufacturing Method for Mask", the entire contents of which are incorporated herein by reference.

FIELD

The disclosure relates to the technical field of semiconductors, in particular to a mask, and a manufacturing method for the mask.

BACKGROUND

At present, an evaporation process is usually adopted for manufacturing an organic light-emitting diode (OLED) display panel, and a mask is an important device in the evaporation process. The mask has a hollowed-out pattern formed by a plurality of evaporation holes, and vapor of an organic light-emitting material is deposited onto a predetermined position on the substrate through the evaporation holes in the mask during evaporation, thus forming an organic light-emitting layer pattern corresponding to the pattern of the evaporation holes.

However, the problem of the easy occurrence of color mixing due to the inaccurate position of evaporation when a pattern of a light-emitting substrate is formed by means of a mask exists in the prior art.

SUMMARY

The disclosure provides a mask, and a manufacturing method for the mask, aiming to solve the problem in the prior art of the easy occurrence of color mixing due to the inaccurate position of evaporation when a pattern of a light-emitting substrate is formed by means of a mask.

An embodiment of the disclosure provides a mask applied for shielding a mother substrate subject to a multi-division exposure procedure, where the mother board has a substrate invalid region with no exposure chance due to the multi-division exposure procedure, where the mask includes: a metal frame; a frame mask, disposed on a side of the metal frame, and including a hollowed-out region and a frame surrounding the hollowed-out region; at least one fine metal strip mask, disposed on a side of the frame mask facing away from the metal frame, and provided with a plurality of openings for evaporation of a light-emitting film in sub-pixels on the mother substrate; and a support plate, disposed between the metal frame and the fine metal strip mask for shielding the substrate invalid region, wherein a thickness of the support plate is greater than a thickness of the frame mask.

In some embodiments, the fine metal strip mask comprises a plurality of evaporation regions, where each evaporation region corresponds to one light-emitting sub-substrate in the mother substrate, and the openings are located in the evaporation regions.

In some embodiments, the hollowed-out region of the frame mask is divided into a plurality of evaporation openings, where each evaporation opening corresponds to one light-emitting sub-substrate in the mother substrate; and the openings are distributed throughout the fine metal strip mask.

In some embodiments, the support plate and the frame mask are of an integrated structure.

In some embodiments, the frame includes an inner frame and an outer frame surrounding the inner frame, wherein the side of the outer frame facing away from the metal frame is thinned relative to the inner frame, and the frame mask is welded to the metal frame at the position of the outer frame.

In some embodiments, a ratio of the thickness of the inner frame to the thickness of the support plate is in a range of 0.9-1.1.

In some embodiments, the thickness of the outer frame is 10%-50% of the thickness of the support plate.

In some embodiments, within a surface of the frame mask facing the metal frame and in a direction perpendicular to an extending direction of the fine metal strip mask, a width of the outer frame is one-fifth to two-thirds of a width of the frame of the frame mask; and within the surface of the frame mask facing the metal frame and in the direction perpendicular to the extending direction of the fine metal strip mask, a width of the outer frame is one-fourth to three-fourths of a width of the metal frame.

In some embodiments, the support plate and the frame mask are two separate components; two ends of the support plate are welded to two opposite sides of the metal frame, respectively.

In some embodiments, the support plate is provided with a welding portion overlapping with the metal frame, and a thickness of the welding portion is 10%-50% of a thickness of a portion other than the welding portion of the support plate.

In some embodiments, the metal frame is provided with a first groove at a position corresponding to the welding portion, and the depth of the first groove is greater than or equal to the thickness of the welding portion.

In some embodiments, an outer edge of the frame mask is provided with a plurality of protruding portions welded to the metal frame; the metal frame is provided with second grooves at positions corresponding to the protruding portions, and the depth of the second groove is greater than or equal to the thickness of the protruding portion.

In some embodiments, the depth of the first groove is greater than the depth of the second groove.

In some embodiments, an orthographic projection of the protruding portion on the metal frame does not overlap with an orthographic projection of the welding portion on the metal frame.

In some embodiments, the depth of the second groove is equal to the thickness of the protruding portion; and the difference between the depth of the first groove and the thickness of the welding portion is the same as the depth of the second groove.

In some embodiments, the thickness of the support plate is 0.5 mm-3 mm.

In some embodiments, the metal frame is further provided with a plurality of transfer grooves.

An embodiment of the disclosure also provides a manufacturing method for the mask according to embodiments of the disclosure, including: providing the metal frame; welding the support plate and the frame mask to one side of the metal frame; and stretching the fine metal strip mask and welding the stretched fine metal strip mask to a side of the frame mask facing away from the metal frame.

In some embodiments, the support plate and the frame mask are of an integrated structure; the frame mask includes a hollowed-out region, and a frame surrounding the hollowed-out region, the frame includes an inner frame and an outer frame surrounding the inner frame, the side of the outer frame facing away from the metal frame is thinned relative to the inner frame, and the frame mask is welded to the metal frame at the position of the outer frame. The welding the frame mask to the side of the metal frame includes welding the outer frame of the frame mask to the metal frame.

In some embodiments, the stretching the fine mask strip and welding the stretched fine metal strip mask to a side of the frame mask facing away from the metal frame includes: stretching the fine metal strip mask obliquely towards the frame mask side to enable the fine metal strip mask to be fully attached to the frame mask; and welding the fine metal strip mask in a stretched state to the frame mask at the position of the inner frame.

In some embodiments, the support plate and the frame mask are two separate components, the support plate is provided with a welding portion overlapping with the metal frame, the metal frame is provided with a first groove at a position corresponding to the welding portion, and the metal frame is provided with second grooves at positions welded to the frame mask. The welding a support plate to one side of the metal frame includes: welding the welding portion of the support plate into the first groove of the metal frame.

In some embodiments, an outer edge of the frame mask is provided with a plurality of protruding portions welded to the metal frame. The welding the frame mask to one side of the metal frame includes: stretching the frame mask and welding the protruding portions of the stretched frame mask into the second grooves of the metal frame.

DETAILED DESCRIPTION

In order to make the objectives, technical solutions and advantages of embodiments of the disclosure clearer, the technical solutions of embodiments of the disclosure will be clearly and completely described below in conjunction with the accompanying drawings of embodiments of the disclosure. Obviously, the described embodiments are some, but not all, embodiments of the disclosure. All other embodiments obtained by a person of ordinary skill in the art based on the described embodiments of the disclosure without creative work fall within the protection scope of the disclosure.

Unless otherwise defined, technical or scientific terms used in the disclosure shall have the ordinary meaning as understood by a person of ordinary skill in the art to which the disclosure belongs. The words such as "first" and "second", as used in the disclosure, do not denote any order, quantity, or importance, but are merely used to distinguish different components. The words such as "including" or "containing" mean that elements or items appearing before the word encompass elements or items listed appearing after the word and equivalents thereof, but do not exclude other elements or items. The words such as "connected" or "connection" are not restricted to physical or mechanical connection, but may include electrical connection, whether direct or indirect. The words such as "up, "down", "left" and "right" are only used to indicate the relative positional relationship, and when the absolute position of the described object changes, the relative positional relationship may also change accordingly.

In order to keep the following description of embodiments of the disclosure clear and concise, the disclosure omits detailed descriptions of known functions and known components.

Figure 1:
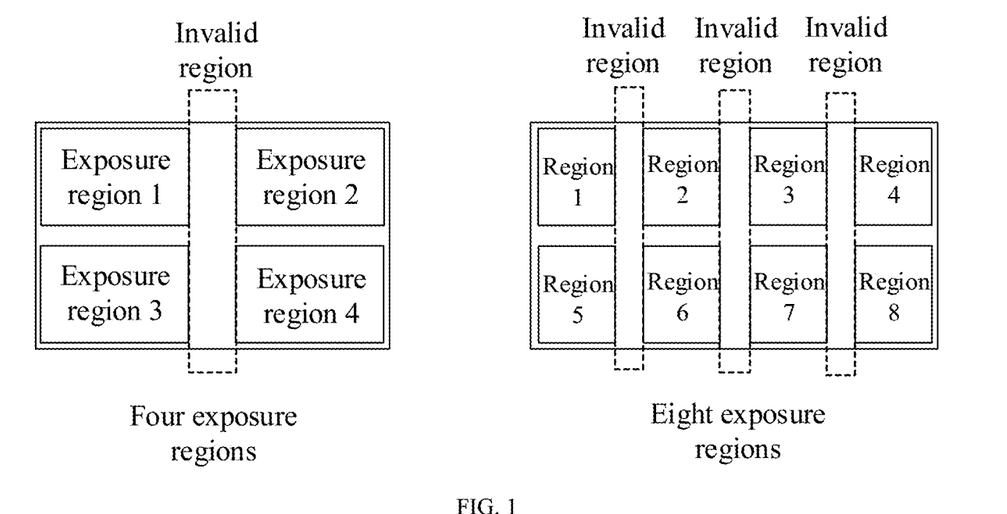
FIG. 1 is a schematic diagram showing a substrate invalid region by a multi-division exposure procedure.

In the process of preparing an organic light-emitting display panel, a photomask of each generation has a fixed size, and has a fixed effective exposure region. When the size of an evaporated substrate is small, the effective exposure region of the photomask may be divided into different regions with different exposure patterns. In the process of translating and aligning the substrate, different exposure regions (shot) of the substrate can be achieved by one photomask, as shown in FIG. 1, thereby reducing the exposure time and cost of a backing film layer. When a photomask is divided multiple times, due to limitations such as manufacturing accuracy, exposure diffraction region, and device accuracy, there is a part that cannot be used for exposure between the two effective exposure regions, i.e., a substrate invalid region. If the organic light-emitting material is evaporated in positions corresponding to the substrate invalid region, the problem of peeling of the organic film layer from the substrate will often occur due to the intrusion of water and oxygen in the subsequent process steps.

In the process of evaporating all layers of organic light-emitting materials onto the substrate, corresponding metal masks are used, and include fine metal masks and common metal masks, for evaporating red (R), green (G), blue (B) pixel light-emitting materials, and organic or metal materials on common layers, respectively. In order to prevent the organic materials from being evaporated onto the substrate invalid region, it is necessary to block the position corresponding to the corresponding substrate invalid region on the metal mask. In the manufacturing process of a conventional metal mask assembly, in order to make the fine metal mask and the substrate completely fit, and the organic material be accurately evaporated onto the corresponding position on the organic light-emitting substrate, it is necessary to perform tensioning on a frame mask (F-mask) and a fine metal mask (FMM) and then laser-weld the stretched masks to a metal frame to assemble the masks into a complete mask (MFA). If in the method of shielding the substrate invalid region, the F-mask or the FMM is not provided with openings at corresponding positions, the problem of poor shadow and color mixing due to uneven stress distribution is prone to occur during the tensioning process.

Figure 2:
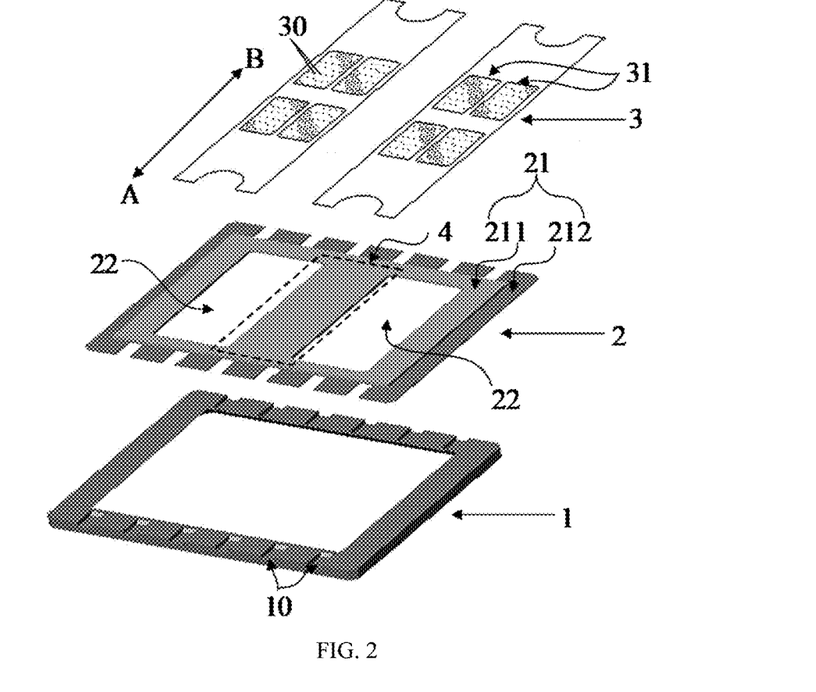
FIG. 2 is a structural schematic diagram of a mask before welding according to an embodiment of the disclosure.
Figure 3:
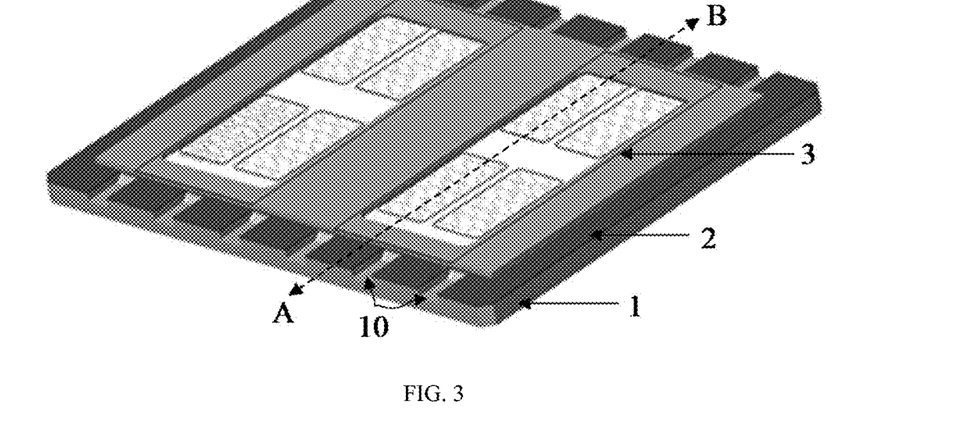
FIG. 3 is a structural schematic diagram of a mask after welding according to an embodiment of the disclosure.

In view of this, referring to FIGS. 2 and 3, FIG. 2 being a structural schematic diagram of a mask before combining and FIG. 3 being a structural schematic diagram of a mask after combining, an embodiment of the disclosure provides a mask for shielding a mother substrate, wherein the mother substrate is formed by a multi-division exposure procedure, and has a substrate invalid region that cannot be exposed due to the multi-division exposure procedure, where the mask includes:

a metal frame 1;

a frame mask 2, on a side of the metal frame 1, and including a hollowed-out region 22, and a frame 21 surrounding the hollowed-out region;

at least one fine metal strip mask 3, on the side of the frame mask 2 facing away from the metal frame 1, and provided with a plurality of openings 30 for the evaporation of a light-emitting film in sub-pixels in the mother substrate; and a support plate 4, between the metal frame 1 and the fine metal strip mask 3 for shielding the substrate invalid region, wherein the thickness of the support plate 4 is greater than the thickness of the frame mask 2.

In embodiments of the disclosure, the mask further includes the support plate, and the thickness of the support plate is greater than the thickness of the frame mask. When the mask is manufactured, since the support plate has a greater thickness and larger rigidity, and is not easy to deform, the support plate can be directly welded to the metal frame without stretching, and will not collapse or bend, thereby avoiding the situation that when the method of shielding substrate invalid region adopts a frame mask or fine metal mask which is not provided with openings at corresponding positions in the prior art, the problem of poor shadow and color mixing due to uneven stress distribution is prone to occur during the tensioning process. Moreover, since the support plate has a greater thickness, a structure above the support plate (i.e. fine metal strip mask) can be effectively supported by the support plate, thereby further reducing the risk of overall sagging of a metal mask assembly.

In some embodiments, the support plate 4 and the frame mask 2 may be of an integrated structure, as shown in FIG. 2, two ends of the support plate 4 are respectively connected to two opposite sides of the frame 21 and the hollowed-out region 22 is divided by the support plate. Specifically, the support plate 4 may be strip-shaped, and the width of the support plate 4 in the direction perpendicular to the extending direction AB of the fine metal strip mask may be smaller than the width of the hollowed-out region 22 (the hollowed-out region 22 before being divided by the support plate 4) in the direction perpendicular to the extending direction AB of the fine metal strip mask. The support plate 4 may divide the hollowed-out region 22 into two regions of identical shape and area, as shown in FIG. 2. In some embodiments, depending on the actual product, one or more support plates 4 of the mask may be provided. The extending directions of the multiple support plates 4 may each be parallel to a short-side direction of the mask, with two ends of each support plate 4 being lapped with two opposite long sides of the mask, respectively; or the extending directions of the multiple support plates 4 may each be parallel to a long-side direction of the mask, with two ends of each support plate 4 being lapped with two opposite short sides of the mask, respectively. According to embodiments of the disclosure that the support plate 4 and the frame mask 2 are of an integrated structure, the overall structure of the mask can be simplified and the difficulty of manufacturing the mask can be reduced.

Figure 4:
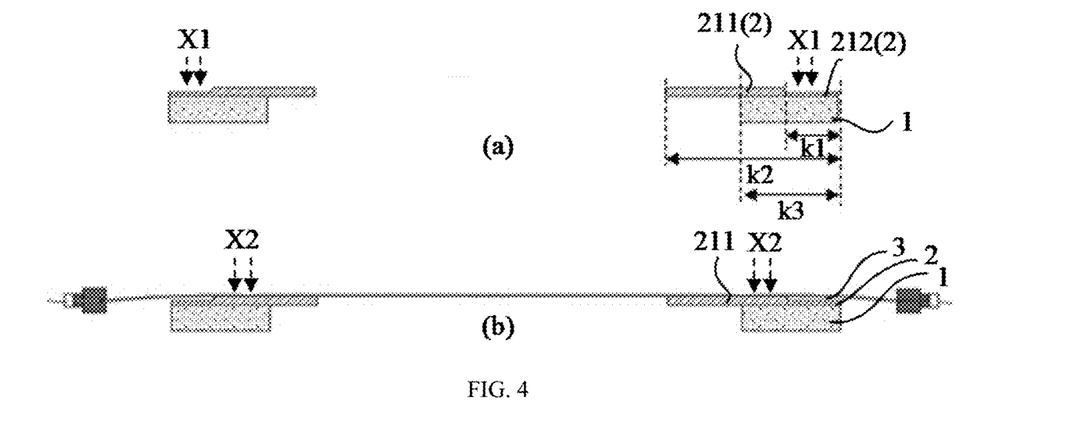
FIG. 4 is a cross-sectional view of FIG. 3 along a dotted line AB.

In some embodiments, referring to FIG. 2 and FIG. 4, FIG. 4 showing a cross-sectional view of FIG. 3 along a dotted line AB, the frame 21 includes an inner frame 211 and an outer frame 212 surrounding the inner frame 211, the side of the outer frame 212 facing away from the metal frame 1 is thinned relative to the inner frame 211, and the frame mask 2 is welded to the metal frame 1 at the position of the outer frame 212, i.e. at the position X1 in FIG. 4. In embodiments of the disclosure, the side of the outer frame 212 facing away from the metal frame 1 is thinned relative to the inner frame 211, so that during welding, this part can be heated and melted by laser, is easy to weld and can be connected to the upper surface of the metal frame 1 easily, so that the overall bonding strength is improved, and the problem that the frame at the welding position is thick, so that it is difficult to completely melt the part in the welding position, and the welding is not firm is solved; in the other hand, the side of the outer frame 212 facing away from the metal frame 1 is thinned relative to the inner frame 211, so that when the fine metal strip mask 3 is tensioned, the fine metal strip mask 3 may be stretched by downward offset to a certain degree, i.e. being stretched obliquely towards the metal frame 1 side, thereby effectively reducing the wrinkles generated when the welding region of the fine metal strip mask 3 is tensioned, improving the tensioning and welding accuracy, enabling the welding region of the fine metal strip mask 3 to fully attach to the frame mask 2, and reducing the risk of false welding occurring due to wrinkles and deformation generated by tensioning.

In some embodiments, referring to FIG. 2, the ratio of the thickness of the inner frame 211 to the thickness of the support plate 4 may be 0.9-1.1. In some embodiments, the thickness of the inner frame 211 may be the same as the thickness of the support plate 4. In embodiments of the disclosure, the frame 21 includes an inner frame 211 and an outer frame 212, and the ratio of the thickness of the inner frame 211 to the thickness of the support plate 4 is 0.9-1.1, that is, the thickness of the inner frame 211 and the thickness of the support plate 4 are approximately the same, while the frame mask can be easy to weld, the frame mask 2 also serves as a support for the support plate 4, so as to avoid the condition that when the frame 21 is thin as a whole, the support plate 21 is difficult to be supported, and the frame 21 is easy to collapse and bend at the position where the support plate 4 is connected.

In some embodiments, the thickness of the outer frame 212 is 10%-50% of the thickness of the support plate 4.

In some embodiments, referring to FIGS. 2 and 4, within the surface of the frame mask 2 facing the metal frame 1 and in the direction perpendicular to the extending direction of the fine metal strip mask 3 (the extending direction of the fine metal strip mask 3 being indicated as line AB in FIG. 2), the width k1 of the outer frame 212 is one-fifth to two-thirds of the width k2 of the frame 21. Specifically, within the surface of the frame mask 2 facing the metal frame 1 and in the direction perpendicular to the extending direction of the fine metal strip mask 3, the width k1 of the outer frame 212 is one-fourth to three-fourths of the width k3 of the metal frame 1. Specifically, for example, the width k1 of the outer frame 212 may be one-third of the width k2 of the frame 2. In embodiments of the disclosure, the width k1 of the outer frame 212 is one-fifth to two-thirds of the width k2 of the frame 2, so that the frame mask 2 can have sufficient support for the support plate 4 when the desired welding width is guaranteed.

In some embodiments, referring to FIG. 4, the inner frame 211 may have a portion overlapping with the metal frame 1 or may have a portion beyond the frame 1.

Figure 5:
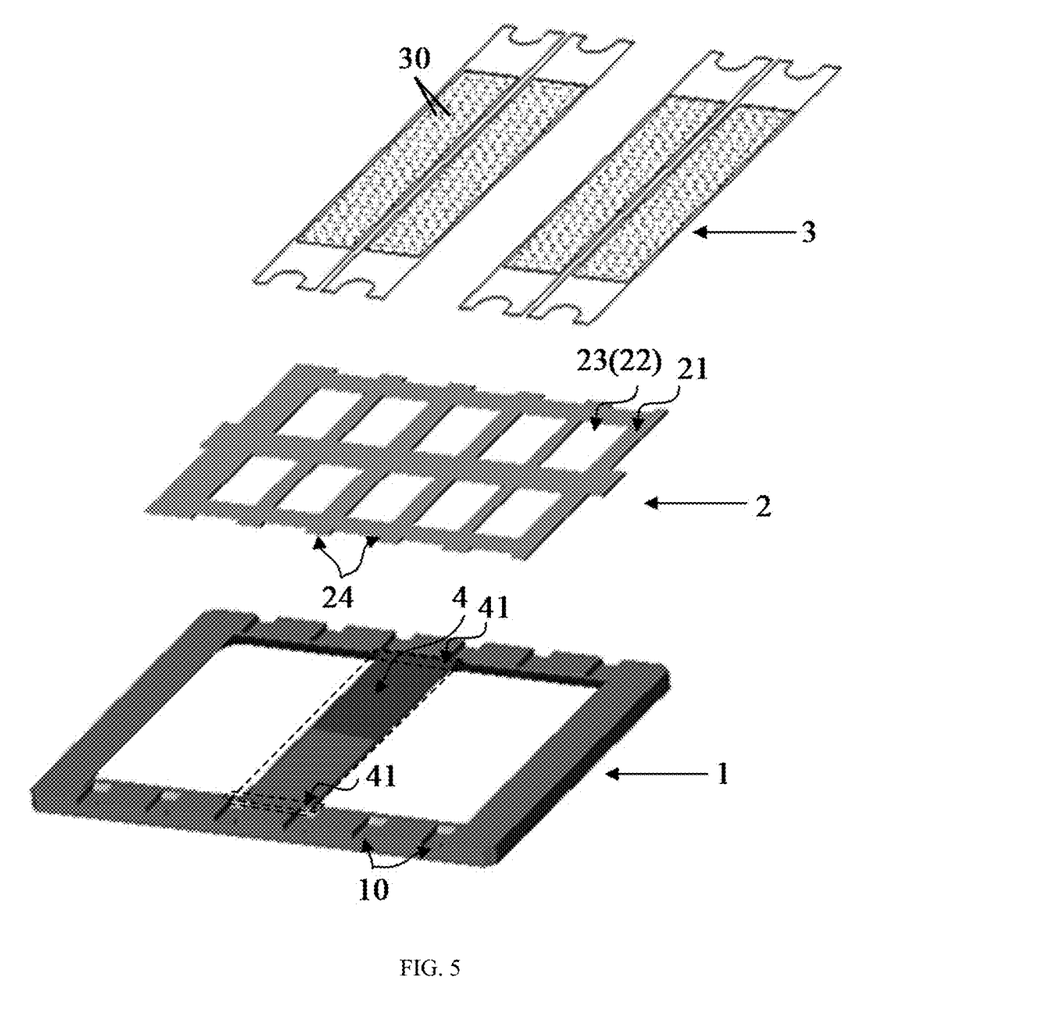
FIG. 5 is a structural schematic diagram of another mask before welding according to an embodiment of the disclosure.
Figure 6:
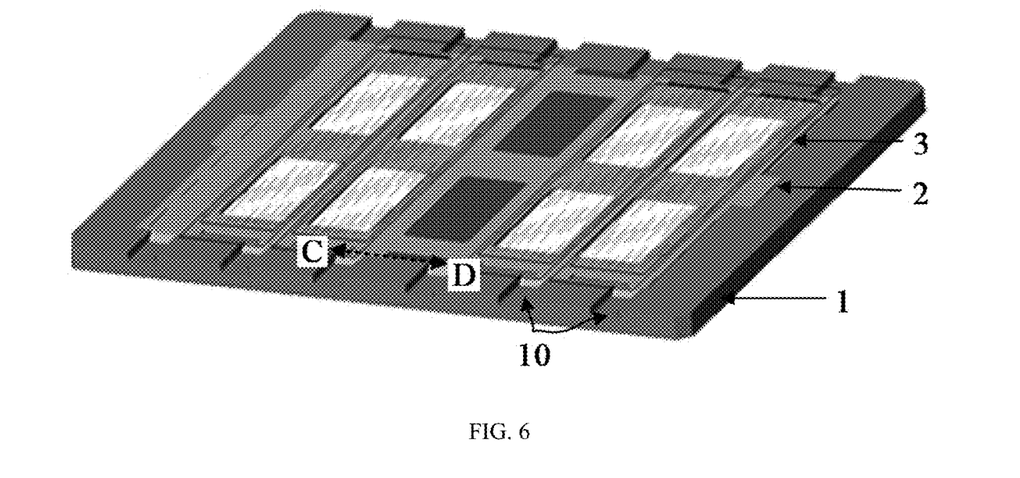
FIG. 6 is a structural schematic diagram of another mask after welding according to an embodiment of the disclosure.

In some embodiments, referring to FIGS. 5 and 6, FIG. 5 being a structural schematic diagram of a mask before welding and FIG. 6 being a structural schematic diagram of a mask after welding, the support plate 4 and the frame mask 2 may also be two separate components before welding; two ends of the support plate 4 are welded to two opposite sides of the metal frame 1 respectively and the opening of the metal frame 1 is divided into two portions. In embodiments of the disclosure, since the support plate 4 and the frame mask 2 are two separate parts, a conventional frame mask may be used, so that the mask is relatively easy to manufacture.

In some embodiments, referring to FIG. 5, the support plate 4 is provided with welding portions 41 overlapping with the metal frame 1, and the thickness of the welding portion 41 is 10%-50% of the thickness of portion other than the welding portion of the support plate 4. In embodiments of the disclosure, the support plate 4 is provided with the welding portions 41 overlapping with the metal frame 1, and the thickness of the welding portion 41 is 10%-50% of the thickness of portion other than the welding portion of the support plate 4, so that during welding, the welding portions 41 can be heated and melted by laser, are easy to weld and can be connected to the upper surface of the metal frame 1 easily, so that the overall bonding strength is improved, and the problem that the frame at the welding position is thick, so that it is difficult to completely melt the welding position, and the welding is not firm is solved.

Figure 7:
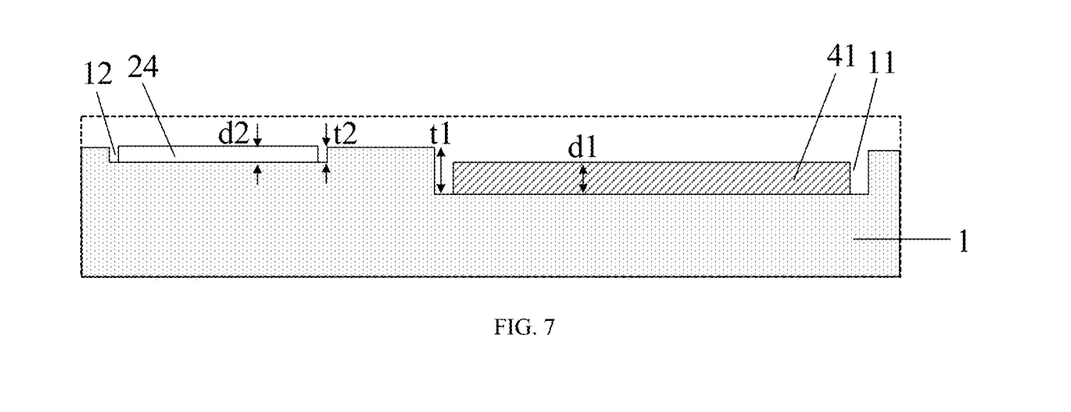
FIG. 7 is a cross-sectional view of FIG. 6 along a dotted line CD.

In some embodiments, referring to FIG. 7 which is a cross-sectional view of FIG. 6 along a dotted line CD, the metal frame 1 is provided with a first groove 11 at a position corresponding to the welding portion 41, and the depth t1 of the first groove 11 is greater than or equal to the thickness d1 of the welding portion 41. In some embodiments, referring to FIGS. 5 and 7, the outer edge of the frame mask 2 is provided with a plurality of protruding portions 24 welded to the metal frame 1; the metal frame 1 is provided with second grooves 12 at positions corresponding to the protruding portions 24, and the depth of the second groove 12 is greater than or equal to the thickness of the protruding portion 24.

In some embodiments, referring to FIG. 7, the orthographic projection of the protruding portion 24 on the metal frame 1 does not overlap with the orthographic projection of the welding portion 41 on the metal frame 1.

In some embodiments, referring to FIG. 7, the depth t1 of the first groove 11 is greater than the depth t2 of the second groove 12.

In some embodiments, referring to FIG. 7, the depth t2 of the second groove 12 is equal to the thickness d2 of the protruding portion 24; the difference between the depth t1 of the first groove 11 and the thickness of the welding portion 41 is the same as the depth t2 of the second groove 12. In embodiments of the disclosure, the frame mask 2 may be flush with the upper surface of the metal frame 1 after welding, thereby ensuring the flatness of the subsequent fine metal strip mask 3.

In some embodiments, the evaporation pattern of the mask may be various, specifically, for example, referring to FIG. 2, the fine metal strip mask 3 includes a plurality of evaporation regions 31, each evaporation region 31 corresponds to one light-emitting sub-substrate in the mother substrate, and the openings 30 are located in the evaporation region 31; the plurality of evaporation regions 31 of the fine metal strip masks 3 are combined with the hollowed-out region 22 of the frame mask 2 to form an evaporation pattern of the mask; for another example, referring to FIG. 5, the hollowed-out region 22 of the frame mask 2 may be divided into a plurality of evaporation openings 23, and each evaporation opening 23 corresponds to one light-emitting sub-substrate in the mother substrate; the openings 30 are distributed throughout the fine metal strip mask 3 (i.e. the openings 30 are evenly distributed in the fine metal strip mask 3 instead of being distributed by regions), and the plurality of evaporation openings 23 of the frame mask 2 are combined with the openings 30 of the fine metal strip mask 3 to form an evaporation pattern of the mask.

In some embodiments, the thickness of the support plate 4 is 0.5 mm –3 mm.

In some embodiments, referring to FIGS. 2-6, the metal frame 1 is also provided with a plurality of transfer grooves 10. The transfer groove 10 can be used for transfer of a mask by a mechanical hand in the evaporation process. When the support plate 4 and the frame mask 2 may be of an integrated structure, referring to FIG. 2, the outer frame 212 of the frame mask 2 may also be provided with outer frame openings corresponding to the transfer grooves 10.

Figure 8:
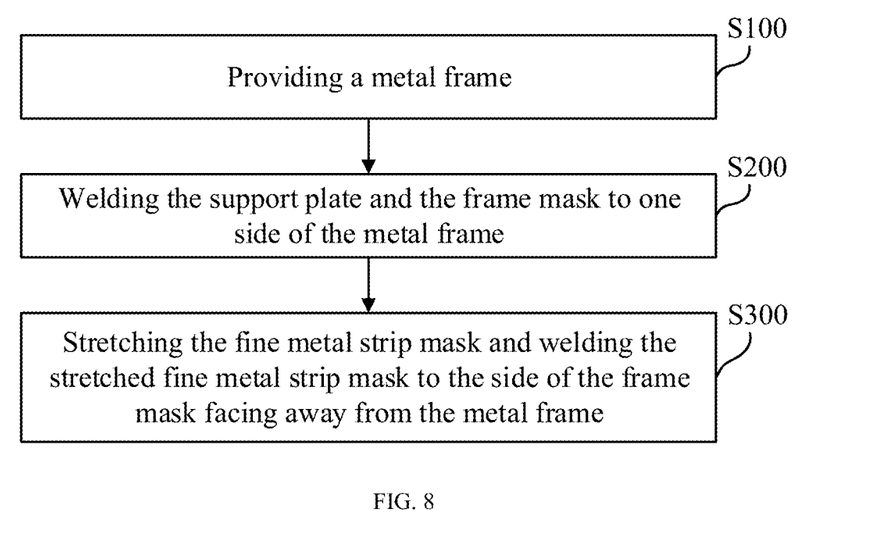
FIG. 8 is a flowchart of manufacturing a mask according to an embodiment of the disclosure.

Based on the same inventive concept, an embodiment of the disclosure further provides a manufacturing method for the mask according to embodiments of the disclosure, referring to FIG. 8, including:
S100: providing a metal frame;
S200: welding a support plate and a frame mask to one side of the metal frame; and
S300: stretching a fine metal strip mask and welding the stretched fine metal strip mask to the side of the frame mask facing away from the metal frame.

In some embodiments, when the mask is of the structure shown in FIGS. 2 and 3, that is, the support plate and the frame mask are of an integrated structure; the frame mask includes a hollowed-out region, and a frame surrounding the hollowed-out region, the frame includes an inner frame and an outer frame surrounding the inner frame, the side of the outer frame facing away from the metal frame is thinned relative to the inner frame, and the frame mask is welded to the metal frame at the position of the outer frame; correspondingly, S200 of welding a frame mask to one side of the metal frame includes welding the outer frame of the frame mask to the metal frame, that is, the frame mask is welded to the metal frame at the outer frame.

Correspondingly, S300 of stretching the fine metal strip mask and welding the stretched fine metal strip mask to the side of the frame mask facing away from the metal frame includes:
stretching the fine metal strip mask obliquely towards the frame mask side to enable the fine metal strip mask to be fully attached to the frame mask; and
welding the fine metal strip mask in a stretched state to the frame mask at the position of the inner frame.

In embodiments of the disclosure, when the support plate and the frame mask are of an integrated structure, since the support plate itself is thick and has large rigidity, it is possible to directly weld the frame mask to the frame without stretching, and it is only necessary to tension and stretch the fine metal strip mask, so that the situation that the frame mask needs to be welded after stretching is avoided, and the steps of manufacturing the mask can be simplified.

In some embodiments, when the mask is of the structure shown in FIGS. 5 and 6, that is, the support plate and the frame mask are two separate parts, the support plate is provided with welding portions overlapping with the metal frame, the metal frame is provided with first grooves at positions corresponding to the welding portions, and the metal frame is provided with second grooves at positions welded to the frame mask.

Correspondingly, S200 of welding a support plate to one side of the metal frame includes welding the welding portions of the support plate into the first grooves of the metal frame.

In some embodiments, the outer edge of the frame mask is provided with a plurality of protruding portions welded to the metal frame; S200 of welding a frame mask to one side of the metal frame includes stretching the frame mask and welding the protruding portions of the stretched frame mask into the second grooves of the metal frame.

In embodiments of the disclosure, the mask further includes the support plate, and the thickness of the support plate is greater than the thickness of the frame mask. When the mask is specifically manufactured, since the support plate has a larger thickness and larger rigidity, and is not easy to deform, the support plate can be directly welded to the metal frame without stretching, and will not collapse or bend, thereby avoiding the situation that when the method of blocking a substrate invalid region adopts a frame mask or fine metal mask which is not provided with openings at corresponding positions in the prior art, the problem of poor shadow and color mixing due to uneven stress distribution is prone to occur during the tensioning process. Moreover, since the support plate has a larger thickness, a structure above the support plate (i.e. fine metal strip mask) can be effectively supported by the support plate, thereby further reducing the risk of overall sagging of a metal mask assembly.

It will be apparent to those skilled in the art that various modifications and variations may be made to the disclosure without departing from the spirit and scope of the disclosure. Thus, if these modifications and variations of the disclosure fall within the scope of the claims of the disclosure and their equivalents, the disclosure is also intended to include these modifications and variations.

What is claimed is:

1. A mask, applied for shielding a mother substrate subject to a multi-division exposure procedure, wherein the mother board has a substrate invalid region with no exposure chance due to the multi-division exposure procedure, wherein the mask comprises:
   a metal frame;
   a frame mask, disposed on a side of the metal frame, and comprising a hollowed-out region and a frame surrounding the hollowed-out region;
   at least one fine metal strip mask, disposed on a side of the frame mask facing away from the metal frame, and provided with a plurality of openings for evaporation of a light-emitting film in sub-pixels on the mother substrate; and
   a support plate, disposed between the metal frame and the fine metal strip mask for shielding the substrate invalid region, wherein a thickness of the support plate is greater than a thickness of the frame mask;
   wherein the metal frame is provided with a plurality of transfer grooves on a top surface of the frame, and the frame mask is provided with a plurality of openings corresponding to the transfer grooves, and in a direction along which the plurality of transfer grooves are arranged, a width of the support plate is greater than a spacing between two adjacent transfer grooves of the plurality of transfer grooves.

2. The mask according to claim 1, wherein the fine metal strip mask comprises a plurality of evaporation regions, wherein each evaporation region corresponds to one light-emitting sub-substrate in the mother substrate, and the openings are located in the evaporation regions.

3. The mask according to claim 1, wherein
   the hollowed-out region of the frame mask is divided into a plurality of evaporation openings, wherein each evaporation opening corresponds to one light-emitting sub-substrate in the mother substrate; and
   the openings are distributed throughout the fine metal strip mask.

4. The mask according to claim 2, wherein the support plate and the frame mask are of an integrated structure.

5. The mask according to claim 4, wherein the frame of the frame mask comprises an inner frame and an outer frame surrounding the inner frame, wherein in a direction of ascending distance from the metal frame, an thickness of the outer frame is smaller than a thickness of the inner frame, and a surface of the outer frame facing the metal frame and a surface of the inner frame facing the metal frame is in same plane; and the frame mask is welded to the metal frame at a position of the outer frame.

6. The mask according to claim 5, wherein a ratio of a thickness of the inner frame to a thickness of the support plate is in a range of 0.9-1.1.

7. The mask according to claim 5, wherein a thickness of the outer frame is 10%-50% of a thickness of the support plate.

8. The mask according to claim 5, wherein within the surface of the frame mask facing the metal frame and in a direction perpendicular to an extending direction of the fine metal strip mask, a width of the outer frame is one-fifth to two-thirds of a width of the frame of the frame mask; and
   within the surface of the frame mask facing the metal frame and in the direction perpendicular to the extending direction of the fine metal strip mask, a width of the outer frame is one-fourth to three-fourths of a width of the metal frame.

9. The mask according to claim 2, wherein
   the support plate and the frame mask are two separate components; and
   two ends of the support plate are welded to two opposite sides of the metal frame, respectively.

10. The mask according to claim 9, wherein the support plate is provided with a welding portion overlapping with the metal frame, and a thickness of the welding portion is 10%-50% of a thickness of a portion other than the welding portion of the support plate.

11. The mask according to claim 10, wherein the metal frame is provided with a first groove at a position corresponding to the welding portion, and a depth of the first groove is greater than or equal to the thickness of the welding portion.

12. The mask according to claim 11, wherein an outer edge of the frame mask is provided with a plurality of protruding portions welded to the metal frame;
   the metal frame is provided with second grooves at positions corresponding to the protruding portions, and a depth of the second groove is greater than or equal to a thickness of the protruding portion.

13. The mask according to claim 12, wherein the depth of the first groove is greater than the depth of the second groove.

14. The mask according to claim 13, wherein an orthographic projection of the protruding portion on the metal frame does not overlap with an orthographic projection of the welding portion on the metal frame.

15. The mask according to claim 14, wherein the depth of the second groove is equal to the thickness of the protruding portion;
a difference between the depth of the first groove and the thickness of the welding portion is same as the depth of the second groove.

16. The mask according to claim 1, wherein a thickness of the support plate is 0.5 mm-3 mm.

17. A manufacturing method for the mask according to claim 1, comprising:
providing the metal frame;
welding the support plate and the frame mask to the side of the metal frame; and
stretching a fine metal strip mask and welding the stretched fine metal strip mask to the side of the frame mask facing away from the metal frame.

18. The manufacturing method according to claim 17, wherein the support plate and the frame mask are of an integrated structure; and the frame mask comprises a hollowed-out region and a frame surrounding the hollowed-out region;
wherein the frame comprises an inner frame and an outer frame surrounding the inner frame, in a direction of ascending distance from the metal frame, an thickness of the outer frame is greater than a thickness of the inner frame, and a surface of the outer frame facing the metal frame and a surface of the inner frame facing the metal frame is in same plane; and
the frame mask is welded to the metal frame at a position of the outer frame;
the welding the frame mask to the side of the metal frame comprises:
welding the outer frame of the frame mask to the metal frame.

19. The manufacturing method according to claim 18, wherein the stretching the fine metal strip mask and welding the stretched fine metal strip mask to the side of the frame mask facing away from the metal frame comprises:
stretching the fine metal strip mask obliquely towards the frame mask side to enable the fine metal strip mask to be fully attached to the frame mask; and
welding the fine metal strip mask in a stretched state to the frame mask at a position of the inner frame.

20. The manufacturing method according to claim 17, wherein the support plate and the frame mask are two separate components;
the support plate is provided with a welding portion overlapping with the metal frame;
the metal frame is provided with a first groove at a position corresponding to the welding portion; and
the metal frame is provided with second grooves at positions welded to the frame mask;
wherein the welding the support plate to the side of the metal frame comprises:
welding the welding portion of the support plate into the first groove of the metal frame.

* * * * *